(12) United States Patent
Tamate (10) Patent No.: US 11,411,660 B2
(45) Date of Patent: Aug. 9, 2022

(54) POWERED DEVICE, POWER SOURCING EQUIPMENT AND POWER OVER FIBER SYSTEM (71) Applicant: KYOCERA Corporation, Kyoto (JP)

(72) Inventor: Shuichi Tamate, Hino (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/417,114

(22) PCT Filed: Jun. 19, 2020

(86) PCT No.: PCT/JP2020/024065
§ 371 (c)(1),
(2) Date: Jun. 22, 2021

(87) PCT Pub. No.: WO2021/014847
PCT Pub. Date: Jan. 28, 2021

(65) Prior Publication Data
US 2022/0094445 A1 Mar. 24, 2022

(30) Foreign Application Priority Data

Jul. 22, 2019 (JP) .............................. JP2019-134237

(51) Int. Cl.
H04B 10/25 (2013.01)
H04B 10/80 (2013.01)
H03F 3/189 (2006.01)

(52) U.S. Cl.
CPC ........... *H04B 10/807* (2013.01); *H04B 10/25* (2013.01); *H03F 3/189* (2013.01); *H04B 10/806* (2013.01); *H04B 10/808* (2013.01)

(58) Field of Classification Search
CPC .... H04B 10/807; H04B 10/25; H04B 10/806; H04B 10/808; H03F 3/189; H02J 50/80; H02J 50/30; H02J 4/00
USPC .................................................. 398/140–172
See application file for complete search history.

(56) References Cited

U.S. PATENT DOCUMENTS

| 5,099,144 A * | 3/1992 | Sai ........................... H02J 50/30 250/551 |
| 5,162,935 A * | 11/1992 | Nelson .................... H04B 10/25 250/227.21 |
| 8,358,893 B1 * | 1/2013 | Sanderson ........... G02B 6/4415 385/101 |
| 9,425,769 B1 * | 8/2016 | White .................. H01Q 15/008 |
| 9,979,480 B1 * | 5/2018 | Schubert ............. H04B 10/807 |

(Continued)

FOREIGN PATENT DOCUMENTS

| CN | 201878048 U | 6/2011 |
| JP | H1189120 A | 3/1999 |

(Continued)

*Primary Examiner* — Dibson J Sanchez
(74) *Attorney, Agent, or Firm* — Hauptman Ham, LLP (57) ABSTRACT A powered device includes a photoelectric conversion element, a detector and a signal outputter. The photoelectric conversion element converts feed light into electric power. The detector detects a magnitude of the electric power being transmitted from the photoelectric conversion element to a load. The signal outputter outputs a detection signal of the detector to outside of the powered device. The detection signal is a signal indicating an envelope of a modulated wave that is output by the load.

4 Claims, 7 Drawing Sheets

(56) References Cited

U.S. PATENT DOCUMENTS

| | | | |
|---|---|---|---|
| 2004/0227057 A1* | 11/2004 | Tuominen | H04B 10/807 250/205 |
| 2009/0016715 A1 | 1/2009 | Furey | |
| 2012/0309333 A1* | 12/2012 | Nambu | H04B 1/0475 455/127.1 |
| 2014/0008990 A1 | 1/2014 | Yoon | |
| 2014/0287681 A1* | 9/2014 | Ollikainen | H02J 50/30 455/41.1 |
| 2014/0315504 A1* | 10/2014 | Sakai | H03F 3/189 455/127.2 |
| 2014/0334824 A1* | 11/2014 | Goldner | H04B 10/807 398/116 |
| 2015/0280652 A1* | 10/2015 | Cohen | H03F 1/0227 330/297 |
| 2016/0049831 A1* | 2/2016 | Nakano | H02J 50/80 307/104 |
| 2016/0197578 A1* | 7/2016 | Dupraz | H02S 50/00 250/205 |
| 2016/0218679 A1* | 7/2016 | Jang | H03F 1/0222 |
| 2017/0019180 A1* | 1/2017 | Lucrecio | H04B 10/1143 |
| 2018/0076772 A1* | 3/2018 | Khesbak | H03G 3/3042 |
| 2018/0241216 A1* | 8/2018 | Ishigaki | H02J 50/80 |
| 2018/0278213 A1* | 9/2018 | Henzler | H03F 3/195 |
| 2018/0342991 A1* | 11/2018 | McCune, Jr. | H02M 1/36 |
| 2019/0064353 A1* | 2/2019 | Nugent, Jr. | G01S 17/04 |
| 2019/0140597 A1* | 5/2019 | Lin | H02M 3/33569 |
| 2019/0229558 A1* | 7/2019 | Pigeon | H04B 10/807 |
| 2020/0091878 A1* | 3/2020 | Maxim | H03F 3/45475 |

FOREIGN PATENT DOCUMENTS

| | | |
|---|---|---|
| JP | 2010135989 A | 6/2010 |
| JP | 2010193374 A | 9/2010 |
| JP | 20151925 A | 1/2015 |

\* cited by examiner

POWERED DEVICE, POWER SOURCING EQUIPMENT AND POWER OVER FIBER SYSTEM

RELATED APPLICATIONS

The present application is a National Phase of International Application Number PCT/JP2020/024065 filed Jun. 19, 2020 and claims priority to Japanese Application Number 2019-134237 filed Jul. 22, 2019.

TECHNICAL FIELD

The present disclosure relates to a powered device, a power sourcing equipment and a power over fiber system.

BACKGROUND ART

Recently, there has been studied an optical power supply system that converts electric power into light (called feed light), transmits the feed light, converts the feed light into electric energy, and uses the electric energy as electric power. There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In conventional optical power supply, even when the magnitude of the load of a power supply destination changes within a short period, energy of feed light that is transmitted from a power sourcing equipment to a powered device is substantially constant. This causes a problem that when the load decreases, an excess energy of the feed light becomes a loss, and a photoelectric conversion element generates heat, and/or causes a problem that when the load increases, shortage of the energy of the feed light occurs.

Solution to Problem

A powered device of the present disclosure includes:
a photoelectric conversion element that converts feed light into electric power;
a detector that detects a magnitude of the electric power being transmitted from the photoelectric conversion element to a load; and
a signal outputter that outputs a detection signal of the detector to outside of the powered device.

A power sourcing equipment of the present disclosure includes:
a laser oscillator that converts electric power into feed light and transmits the feed light to a powered device;
a signal receiver that receives, from outside of the power sourcing equipment, a detection signal indicating a magnitude of electric power to supply; and
an output controller that controls output of the laser oscillator based on the received detection signal.

A power over fiber system of the present disclosure includes:
The above powered device;
the above power sourcing equipment;
a first optical fiber through which the feed light is transmitted; and
a signal path through which the detection signal is transmitted.

DESCRIPTION OF EMBODIMENTS

Hereinafter, embodiments of the present disclosure will be described with reference to the drawings.

(1) Outline of System

First Embodiment

Figure 1:
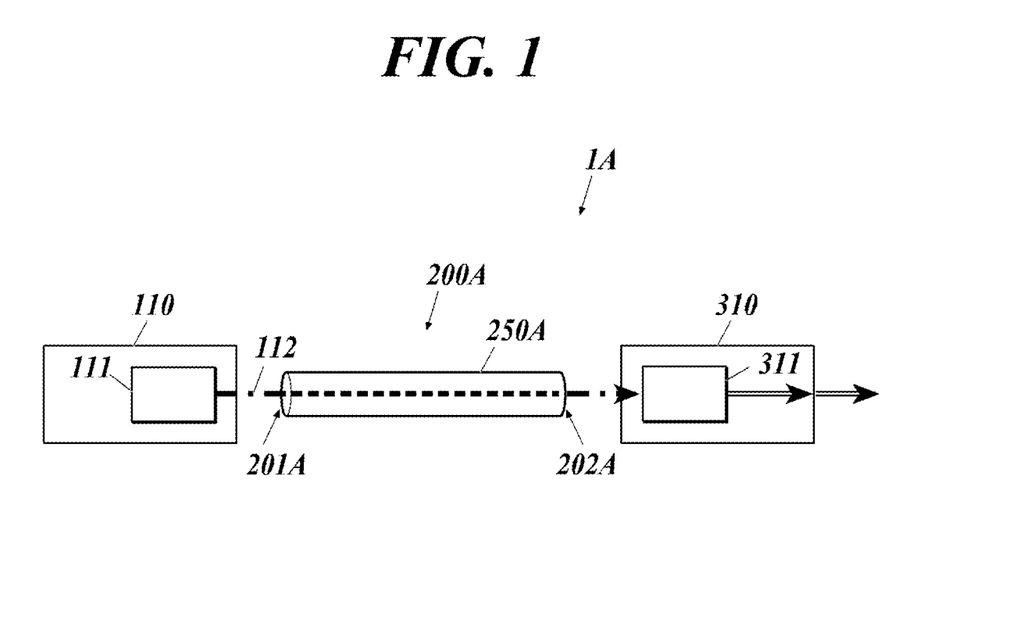
FIG. 1 is a block diagram of a power over fiber system according to a first embodiment of the present disclosure.

As shown in FIG. 1, a power over fiber (PoF) system 1A (optical power supply system) of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
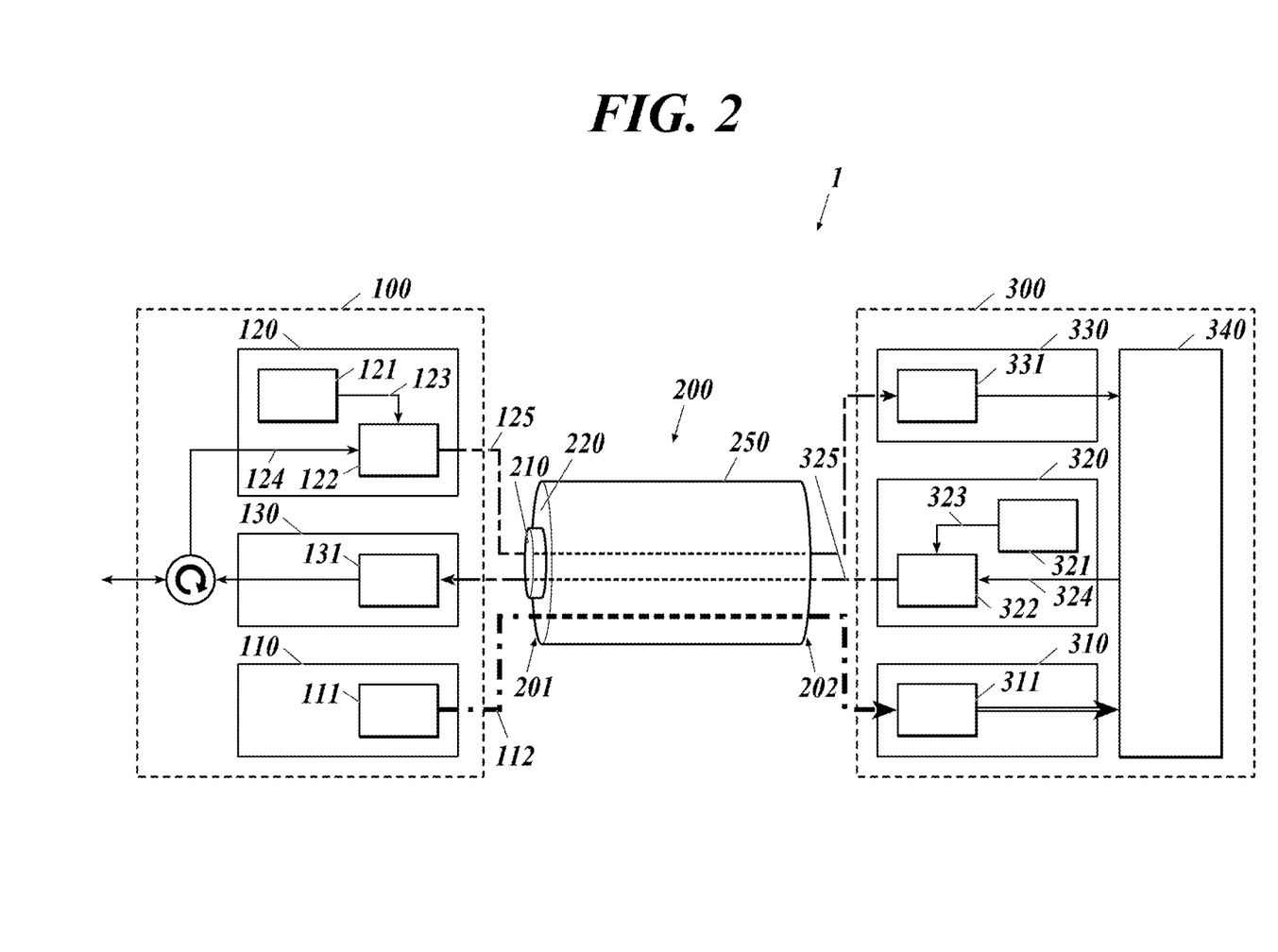
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) 110; an optical fiber cable 200; and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
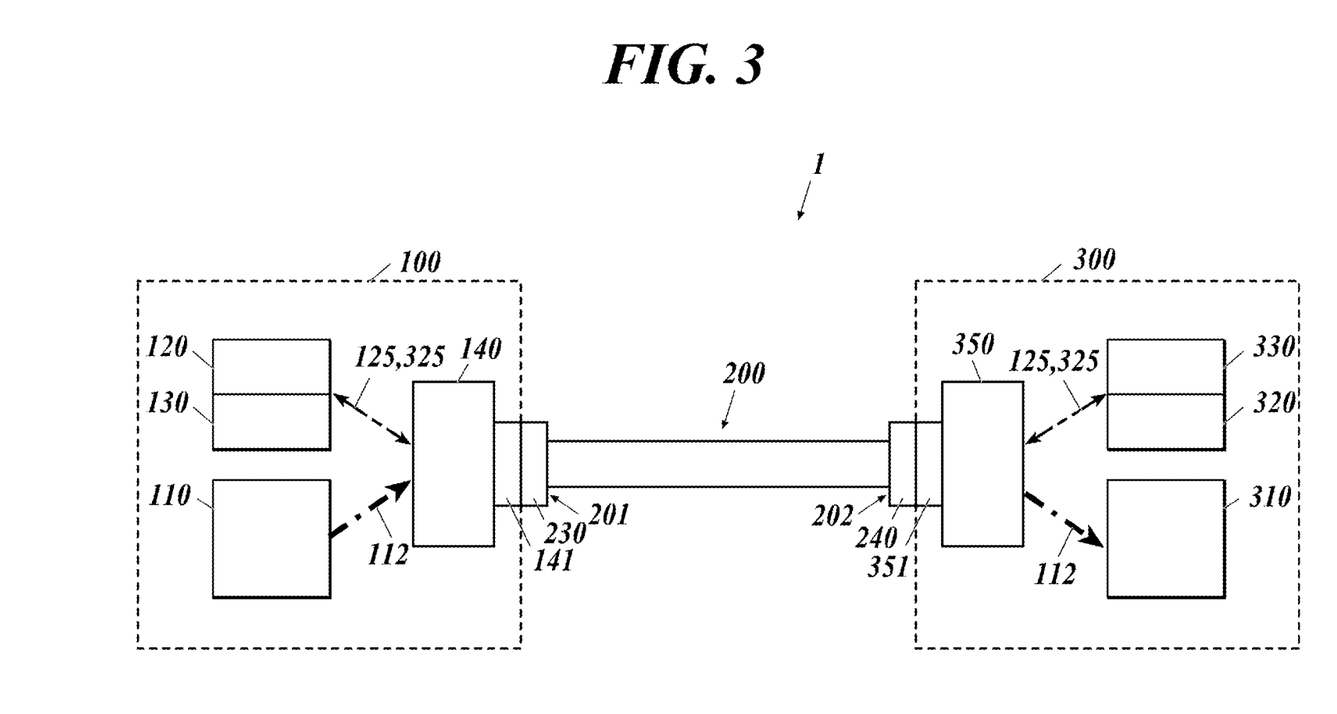
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125/325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
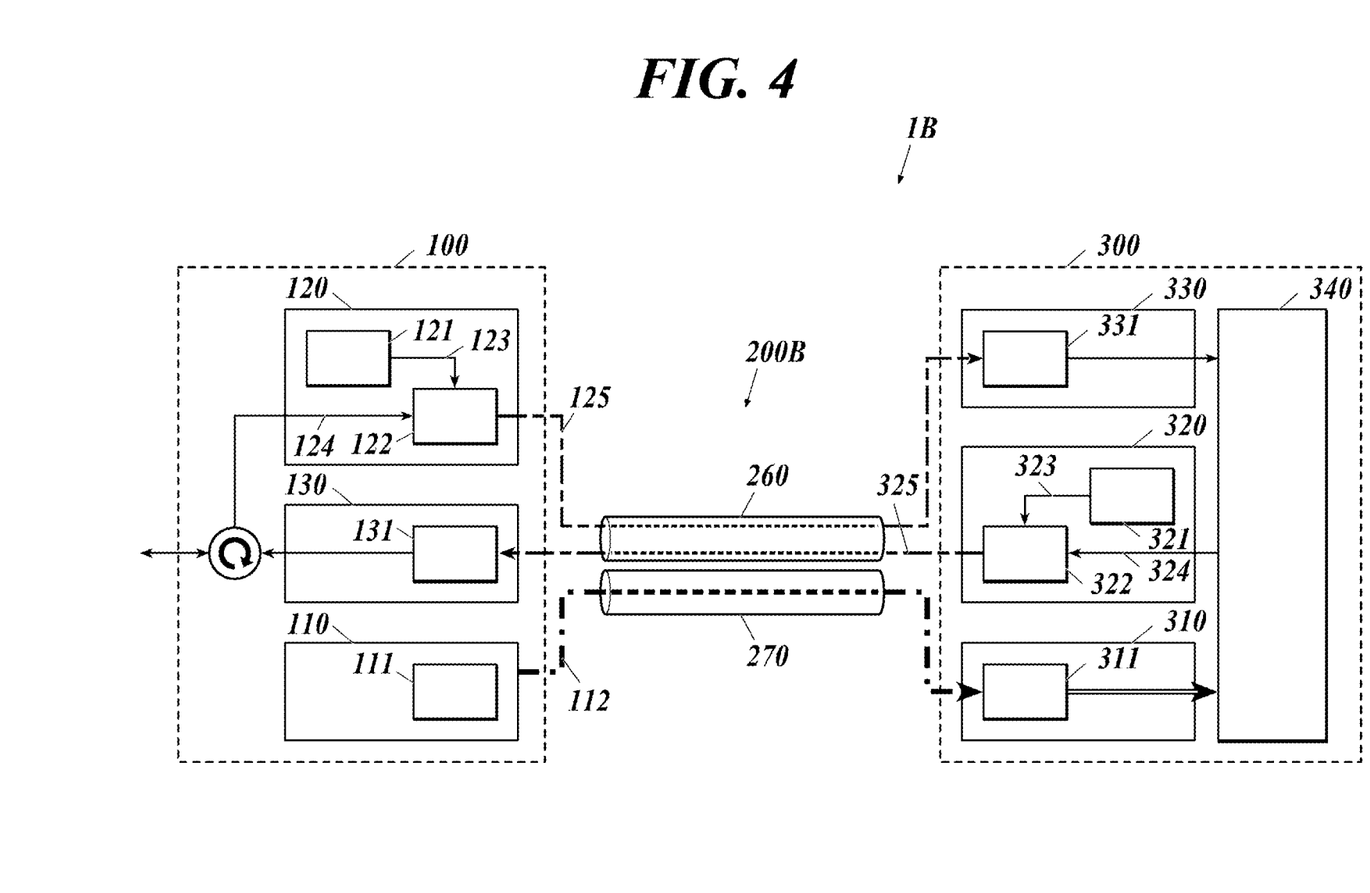
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Means for Controlling Energy of Feed Light

Next, a power over fiber system to which a means for controlling energy of feed light is applied will be described.

Third Embodiment

Figure 5:
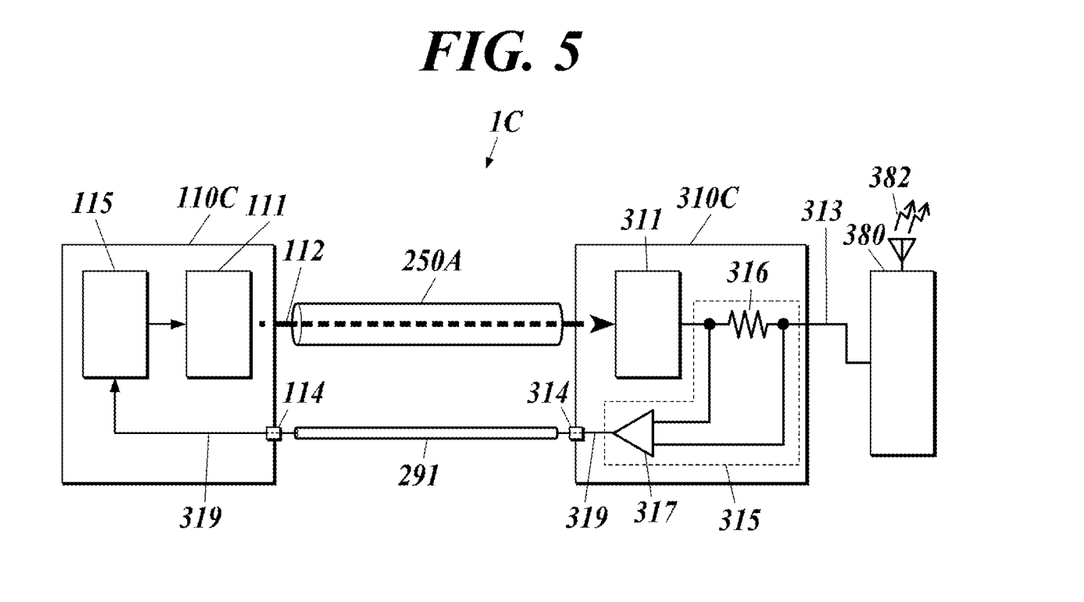
FIG. 5 is a block diagram of a power over fiber system according to a third embodiment to which a means for controlling energy of feed light is applied.

FIG. 5 is a block diagram of a power over fiber system according to a third embodiment to which the means for controlling energy of feed light is applied. In FIG. 5, the same components as those described above are denoted by the same reference signs, and detailed descriptions thereof are omitted.

A power over fiber system 1C of the third embodiment includes a power sourcing equipment 110C, a powered device 310C, an optical fiber 250A, and a metal line 291 as a signal path of a detection signal(s) 319.

The powered device 310C includes a photoelectric conversion element 311 that converts feed light into electric power, a power line 313 that transmits the electric power obtained by the conversion to a load 380, a detector 315 that detects the magnitude of the electric power to be transmitted to the load 380, and a signal outputter 314 that outputs the detection signal of the detector 315 to outside of the powered device 310C. The detector 315 includes, for example, a detector resistor 316 that detects current flowing to the power line 313, and an amplifier 317 that amplifies voltage between the ends of the detector resistor 316 and generates the detection signal 319.

Figure 6:
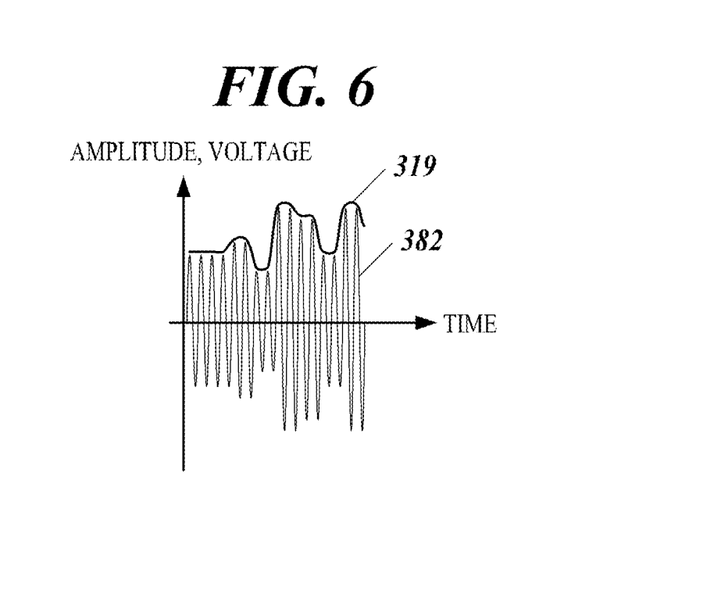
FIG. 6 is a waveform chart showing an example of output of a load and a detection signal.

FIG. 6 is a waveform chart showing output of a load and a detection signal. The load 380 may be a module having a power amplifier the output of which fluctuates, such as a communication device that outputs a modulated wave 382 with amplitude modulation. The communication device may be a wireless device. The detector 315 detects the current flowing to the load 380 through the power line 313, and generates the detection signal 319. In this configuration, the electric power to be transmitted to the load 380 changes according to the amplitude of the modulated wave 382, and the detection signal 319 forms the envelope of the modulated wave 382 that is output from the load 380 (see FIG. 6).

When the current flowing in the power line 313 contains a frequency component corresponding to a carrier wave of the load 380, the detector 315 may include a filter that removes the frequency component, or may adopt the amplifier 317 having a frequency characteristic that removes the frequency component. A configuration may be used in which the frequency component corresponding to the carrier wave does not appear in the input current of the load 380. In this case, the detector 315 may be configured to detect the current flowing in the power line 313 with a flat frequency characteristic.

The power sourcing equipment 110C includes a semiconductor laser 111 for power supply as a laser oscillator, a signal receiver 114 that receives the detection signal 319 from outside of the power sourcing equipment 110C, and an output controller 115 that controls output power of the semiconductor laser 111 on the basis of the received detection signal 319. The output controller 115 controls, on the basis of the detection signal 319, such that the output power of the semiconductor laser 111 increases when the electric power to be supplied to the load 380 is large, and the output power of the semiconductor laser 111 decreases when the electric power to be supplied to the load 380 is small.

According to the power over fiber system 1C of the third embodiment, even when the magnitude of the electric power that is consumed by the load 380 changes within a short period, the detection signal 319 indicating the magnitude of the electric power is transmitted from the powered device 310C to the power sourcing equipment 110C. Then, in accordance with the detection signal 319, the output controller 115 controls the output of the semiconductor laser 111. Thus, the intensity of the feed light 112 changes according to the increase/decrease in the electric power that is consumed by the load 380. This can suppress a situation in which excess energy of the feed light 112 increases when the power consumption of the load 380 decreases, and also suppress a situation in which shortage of the energy of the feed light 112 occurs when the power consumption of the load 380 increases.

Further, according to the power over fiber system 1C of the third embodiment, the detection signal 319 corresponds to the envelope of the modulated wave 382 that is output from the load 380. Hence, when the load 380 is, for example, a large-output communication device that outputs the modulated wave 382 by using a power amplifier, input power and output power of the power amplifier are balanced, and accordingly power-added efficiency of the power amplifier is improved. Therefore, power conversion efficiency in the load 380 can be improved, and also heat generation can be suppressed.

A comparison is made with a configuration in which power of the feed light 112 is constant, and the power line 313 is provided with a smoothing circuit that smooths the input power to cope with the increase/decrease in the power consumption of the load 380. In the case where the electric power relatively greatly increases/decreases within a short period, such as the case where the modulated wave 382 with amplitude modulation is output with large power, in order that the smoothing circuit, which smooths electric power, copes with this, a costly circuit element is required. Meanwhile, according to the configuration of the third embodiment, the detector 315 can be configured inexpensively, and accordingly component cost of the system can be reduced.

The power over fiber system 1C of the third embodiment is effective, for example, in a case where the load 380 with large fluctuations in electric power is installed at a predetermined location, and the optical fiber 250A and the metal line 291 have been laid near the installation location of the load 380. In this case, application of the power over fiber system 1C makes it possible to supply electric power from a power source to the load 380 with high efficiency by utilizing the already-laid optical fiber 250A and metal line 291, without newly laying a power line through which large electric power can flow.

The means for controlling energy of feed light shown in the third embodiment may be applied to the system configuration of FIG. 1, FIG. 2 or FIG. 4. More specifically, the power sourcing equipment 110 and the powered device 310 of FIG. 1, FIG. 2 or FIG. 4 are replaced by the power sourcing equipment 110C and the powered device 310C of the third embodiment, respectively, and the metal line 291 through which the detection signal 319 is transmitted is added. Thus, the above application can be carried out. When the means is applied to the system configuration of FIG. 2, the feed light 112 is transmitted through the optical fiber 250, whereas when the means is applied to the system configuration of FIG. 4, the feed light 112 is transmitted through the optical fiber 270.

Fourth Embodiment

Figure 7:
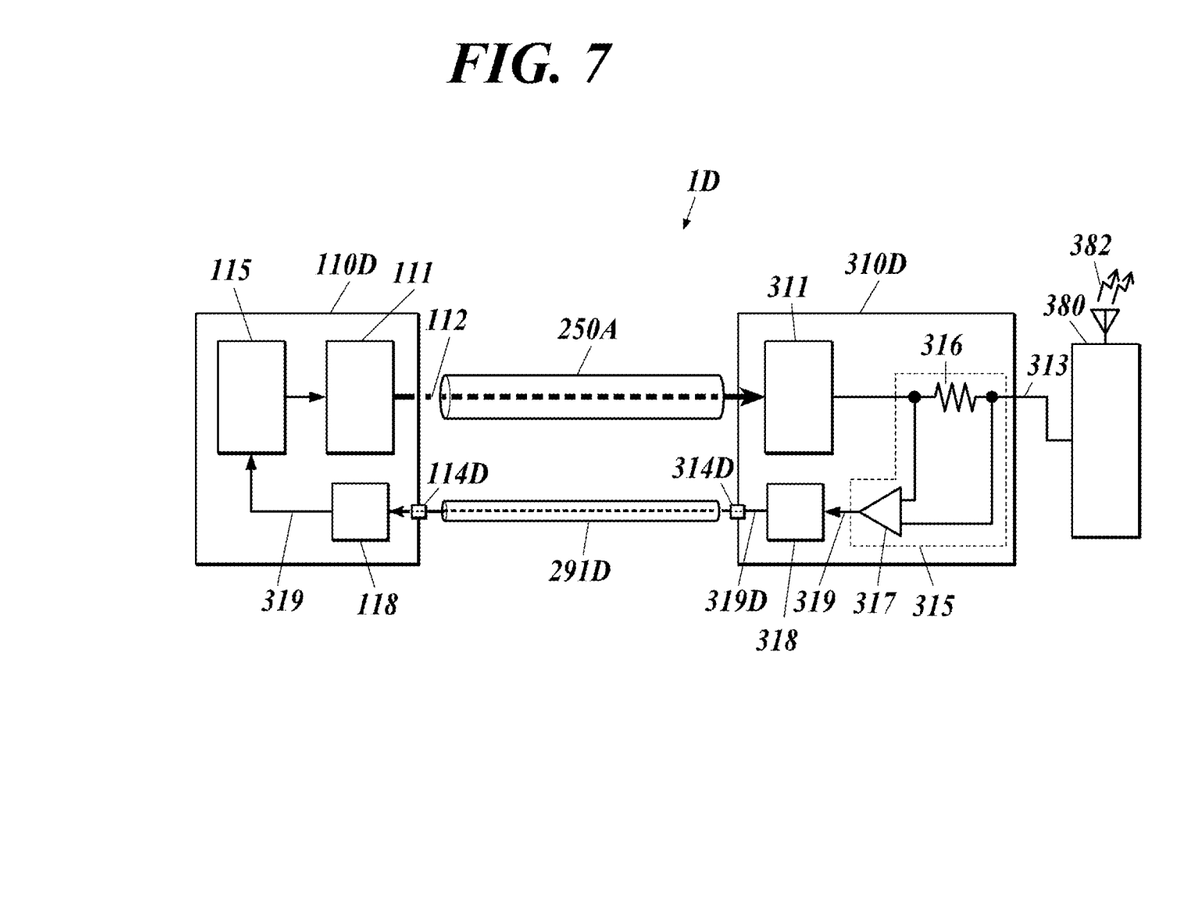
FIG. 7 is a block diagram of a power over fiber system according to a fourth embodiment to which the means for controlling energy of feed light is applied.

FIG. 7 is a block diagram of a power over fiber system according to a fourth embodiment to which the means for controlling energy of feed light is applied. In FIG. 7, the same components as those described above are denoted by the same reference signs, and detailed descriptions thereof are omitted. A power over fiber system 1D of the fourth embodiment is configured such that the detection signal 319 is converted into signal light 319D, and the signal light 319D is transmitted from a powered device 310D to a power sourcing equipment 110D through an optical fiber 291D. The optical fiber 291D corresponds to the signal path of the detection signal 319.

The power over fiber system 1D of the fourth embodiment includes the powered device 310D, the power sourcing equipment 110D, the optical fiber 250A (first optical fiber), and the optical fiber 291D (second optical fiber) through which the signal light 319D is transmitted. The optical fibers 291D, 250A are separate components.

The powered device 310D includes a photoelectric conversion element 311, a power line 313, a detector 315, a light emitter 318 (e.g. a semiconductor laser for signals) that converts the detection signal 319 into the signal light 319D, and a signal outputter 314D that outputs the signal light 319D to outside of the powered device 310D. The light emitter 318 may be replaced by a combination of a laser oscillator that outputs laser light as a carrier wave and a modulator that modulates the laser light.

The power sourcing equipment 110D includes a semiconductor laser 111 for power supply, an output controller 115, a signal receiver 114D that receives the signal light 319D from outside of the power sourcing equipment 110D, and a photoelectric converter 118 (e.g. a photodiode for signals) that converts the signal light 319D into the detection signal 319 that is an electric signal.

According to the power over fiber system 1D of the fourth embodiment, as with the third embodiment, the intensity of the feed light 112 changes according to the electric power that is consumed by the load 380, and the effects based on this are obtained as with the third embodiment.

The power over fiber system 1D of the fourth embodiment is effective, for example, in a case where the load 380 with large fluctuations in electric power is installed at a predetermined location, and the optical fiber 250A for optical power supply and the optical fiber 291D for signal light have been laid near the installation location of the load 380. In this case, application of the power over fiber system 1D makes it possible to supply electric power from a power source to the load 380 with high efficiency by utilizing the already-laid optical fibers 250A, 291D, without newly laying either a power line through which large electric power can flow or a metal line.

The means for controlling energy of feed light shown in the fourth embodiment may be applied to the system configuration of FIG. 1, FIG. 2 or FIG. 4. More specifically, the power sourcing equipment 110 and the powered device 310 of FIG. 1, FIG. 2 or FIG. 4 are replaced by the power sourcing equipment 110D and the powered device 310D of the fourth embodiment, respectively, and the optical fiber 291D through which the detection signal 319 is transmitted is added. Thus, the above application can be carried out. When the means is applied to the system configuration of FIG. 2, the feed light 112 is transmitted through the optical fiber 250, whereas when the means is applied to the system configuration of FIG. 4, the feed light 112 is transmitted through the optical fiber 270.

When the means is applied to the system configuration of FIG. 4, the signal light 319D may be transmitted through the optical fiber 260 together with the signal light 125/325. Further, the optical fiber 291D may be omitted. Still further, the detection signal 319 may be converted into the signal light 319D by the transmitter 320, and/or the signal light 319D may be converted into the detection signal 319 by the receiver 130. Yet further, information of the detection signal 319 may be contained in the signal light 325.

Fifth Embodiment

Figure 8:
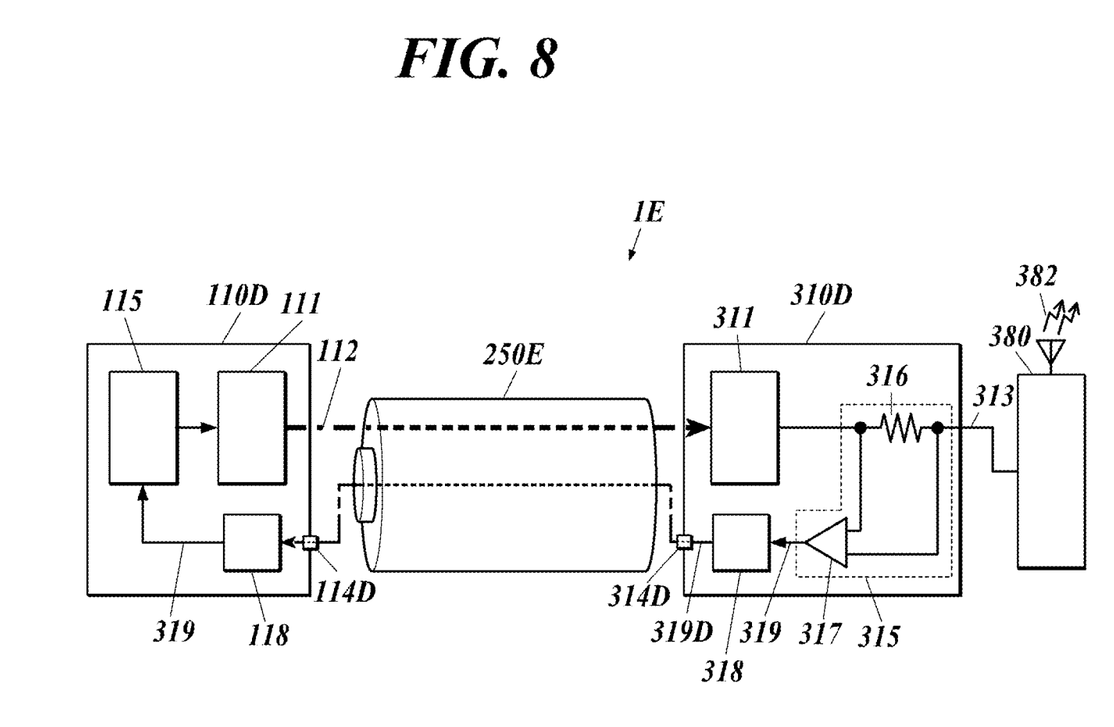
FIG. 8 is a block diagram of a power over fiber system according to a fifth embodiment to which the means for controlling energy of feed light is applied.

FIG. 8 is a block diagram of a power over fiber system according to a fifth embodiment to which the means for controlling energy of feed light is applied. In FIG. 8, the same components as those described above are denoted by the same reference signs, and detailed descriptions thereof are omitted.

A power over fiber system 1E of the fifth embodiment is the same as that of the fourth embodiment except that in the fifth embodiment, the transmission path of the feed light 112 and the transmission path of the signal light 319D, which represents the detection signal 319, are included in one optical fiber 250E. The optical fiber 250E includes a core and a plurality of claddings. Two of the core and the plurality of claddings are set as a first transmission path and a second transmission path, and the feed light 112 and the signal light 319D are transmitted through the first transmission path and the second transmission path, respectively.

According to the power over fiber system 1E of the fifth embodiment, as with the third and fourth embodiments, the intensity of the feed light 112 changes according to the electric power that is consumed by the load 380, and the effects based on this are obtained as with the third and fourth embodiments.

The power over fiber system 1E of the fifth embodiment is effective, for example, in a case where the load 380 with large fluctuations in electric power is installed at a predetermined location, and the optical fiber 250E, which can transmit feed light and signal light, has been laid near the installation location of the load 380. In this case, application of the power over fiber system 1E of the fifth embodiment makes it possible to supply electric power from a power source to the load 380 with high efficiency by utilizing the already-laid optical fiber 250E, without newly laying either a power line through which large electric power can flow or a metal line.

The means for controlling energy of feed light shown in the fifth embodiment may be applied to the system configuration of FIG. 1, FIG. 2 or FIG. 4. More specifically, the power sourcing equipment 110 and the powered device 310 of FIG. 1, FIG. 2 or FIG. 4 are replaced by the power sourcing equipment 110D and the powered device 310D of the fifth embodiment, respectively. In addition, when the means is applied to the system configuration of FIG. 1 or FIG. 4, the optical fiber 250A or 270 that transmits the feed light 112 is replaced by the optical fiber 250E of the fifth embodiment. Thus, the above application can be carried out. When the means is applied to the system configuration of FIG. 2, the feed light 112 and the signal light 319D may be transmitted through the optical fiber 250. When the system configuration of FIG. 2 is used, the detection signal 319 may be converted into the signal light 319D by the transmitter 320, the signal light 319D may be converted into the detection signal 319 by the receiver 130, and/or information of the detection signal 319 may be contained in the signal light 325.

Although some embodiments of the present disclosure have been described above, these embodiments are made for purposes of illustration and example only. The present invention can be carried out in various other forms, and each component may be omitted, replaced or modified/changed within a range not departing from the scope of the present invention. For example, the load to which electric power is supplied from the powered device is not limited to a communication device or a wireless device, and hence may be any device. Further, the configuration of the detector that detects the magnitude of electric power is not limited to the specific examples shown in the embodiments, and hence may be any one of various circuit configurations.

INDUSTRIAL APPLICABILITY

The present disclosure is applicable to a powered device, a power sourcing equipment and a power over fiber system.

The invention claimed is:

1. A light feeding system, comprising:
   a powered device;
   a power sourcing equipment,
   wherein
       the powered device includes
           a photoelectric conversion element configured to convert feed light provided by the power sourcing equipment into electric power;
           a detector configured to detect a magnitude of the electric power being transmitted from the photoelectric conversion element to a load; and
           a signal outputter configured to output a detection signal of the detector to the power sourcing equipment outside of the powered device,
       the detection signal is a signal indicating an envelope of a modulated wave that is output by the load,
       the electric power to be transmitted to the load changes according to an amplitude of the modulated wave, and
       the power sourcing equipment includes:
           a laser oscillator configured to convert input electric power into the feed light and transmit the feed light to the powered device;
           a signal receiver configured to receive the detection signal from the powered device outside of the power sourcing equipment; and
           an output controller configured to control output of the laser oscillator based on the received detection signal;
   a first optical fiber through which the feed light is transmitted; and
   a signal path through which the detection signal is transmitted.

2. The light feeding system according to claim 1, wherein the signal path is a metal line.

3. The light feeding system according to claim 1, wherein the signal path is a second optical fiber separate from the first optical fiber.

4. The light feeding system according to claim 1,
   wherein the first optical fiber includes a plurality of transmission paths including a core and a cladding, and
   wherein the signal path is, among the plurality of transmission paths, a transmission path separate from a transmission path of the feed light.

* * * * *